(12) United States Patent
Li et al.

(10) Patent No.: US 11,017,872 B2
(45) Date of Patent: May 25, 2021

(54) GATE DRIVING CIRCUIT, DISPLAY DEVICE AND DRIVING METHOD

(71) Applicant: BOE TECHNOLOGY GROUP CO., LTD., Beijing (CN)

(72) Inventors: Yongqian Li, Beijing (CN); Zhidong Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/434,200

(22) Filed: Jun. 7, 2019

(65) Prior Publication Data
US 2020/0043564 A1    Feb. 6, 2020

(30) Foreign Application Priority Data
Aug. 3, 2018   (CN) .......................... 201810880068.1

(51) Int. Cl.
*G11C 19/28*       (2006.01)
*G09G 3/20*        (2006.01)

(52) U.S. Cl.
CPC ............. *G11C 19/287* (2013.01); *G09G 3/20* (2013.01); *G09G 2300/0426* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 2010/0109738 | A1* | 5/2010 | Chien ................... G11C 19/28 327/295 |
| 2015/0325181 | A1 | 11/2015 | Wang |
| 2016/0133184 | A1 | 5/2016 | Gupta et al. |
| 2017/0162122 | A1* | 6/2017 | In .......................... G09G 3/3266 |
| 2017/0256198 | A1 | 9/2017 | Hwang et al. |
| 2018/0174507 | A1 | 6/2018 | Ohara et al. |

FOREIGN PATENT DOCUMENTS

| CN | 102324223 A | 1/2012 |
| CN | 102859207 A | 1/2013 |
| CN | 104157248 A | 11/2014 |
| CN | 105243996 A | 1/2016 |
| CN | 105761663 A | 7/2016 |

(Continued)

OTHER PUBLICATIONS

First Office Action for Chinese Application No. 201810880068.1, dated Dec. 12, 2019, 10 Pages.

(Continued)

*Primary Examiner* — Stephen T. Reed
(74) *Attorney, Agent, or Firm* — Brooks Kushman P.C.

(57) ABSTRACT

A gate driving circuit includes M levels of shift registers. Each level of shift register includes a first register unit and a second register unit. The first register units of the M levels of shift registers are connected to each other in a cascaded manner, the second register units of the M levels of shift registers are connected to each other in a cascaded manner, and an output end of the first register unit and an output end of the second register unit of each level of shift register are electrically connected to an output end of the level of shift register, where M is a positive integer greater than or equal to 1.

7 Claims, 5 Drawing Sheets

(56) References Cited

FOREIGN PATENT DOCUMENTS

CN  107274832 A  10/2017
CN  107710318 A  2/2018

OTHER PUBLICATIONS

1$^{st}$ Chinese Office Action, English Translation.
CN102324223A, English Abstract and Machine Translation.
CN102859207A, English Abstract and Machine Translation.
CN104157248A, English Abstract and U.S. Equivalent U.S. Pub. No. 2015/0325181.
CN105243996A, English Abstract and U.S. Equivalent U.S. Pub. No. 2017/0256198.
CN105761663A, English Abstract and Machine Translation.
CN107274832A, English Abstract and Machine Translation.
CN107710318A, English Abstract and U.S. Equivalent U.S. Pub. No. 2018/0174507.

* cited by examiner

GATE DRIVING CIRCUIT, DISPLAY DEVICE AND DRIVING METHOD

CROSS-REFERENCE TO RELATED APPLICATION

This application claims priority to Chinese Patent Application No. 201810880068.1 filed on Aug. 3, 2018, which is incorporated herein by reference in its entirety.

TECHNICAL FIELD

The present disclosure relates to the field of display technology, in particular to a gate driving circuit, a display device and a method for driving the gate driving circuit.

BACKGROUND

In the related art, a driving method for driving a waveform of external compensation pixel circuit architecture is of a complex structure, and it is very difficult to acquire a desired waveform through a Gate Driver on Array (GOA) technique. Hence, the manufacture cost of an Organic Light-Emitting Diode (OLED) display is relatively high.

SUMMARY

In one aspect, the present disclosure provides in some embodiments a gate driving circuit, including M levels of shift registers. Each level of shift register includes a first register unit and a second register unit. The first register units of the M levels of shift registers are connected to each other in a cascaded manner, the second register units of the M levels of shift registers are connected to each other in a cascaded manner, and an output end of the first register unit and an output end of the second register unit of each level of shift register are electrically connected to an output end of the level of shift register, where M is a positive integer greater than or equal to 1.

In a possible embodiment of the present disclosure, each level of shift register further comprises a first switching unit configured to cut off a signal outputted from the output end of the first register unit, and a second switching unit configured to cut off a signal outputted from the output end of the second register unit.

In a possible embodiment of the present disclosure, the first register unit comprises a first input unit and a first output transistor, an output end of the first input unit is electrically connected to a gate electrode of a first output transistor, and a first electrode of the first output transistor is electrically connected to a first clock signal input end.

In a possible embodiment of the present disclosure, the first register unit comprises a first pull-down transistor, a first electrode of a first pull-down transistor is electrically connected to a second electrode of the first output transistor, and a second electrode of the first pull-down transistor is connected to a low level end.

In a possible embodiment of the present disclosure, the first switching unit comprises a first switching transistor, a first electrode of the first switching transistor is electrically connected to the gate electrode of the first output transistor, and a second electrode of the first switching transistor is connected to the low level end.

In a possible embodiment of the present disclosure, the first switching unit further comprises a second switching transistor, a first electrode of the second switching transistor is electrically connected to a gate electrode of the first pull-down transistor, and a second electrode of the second switching transistor is connected to the low level end.

In a possible embodiment of the present disclosure, a gate electrode of the first switching transistor is electrically connected to a gate electrode of the second switching transistor.

In a possible embodiment of the present disclosure, the second register unit comprises a second input unit and a second output transistor, an output end of the second input unit is electrically connected to a gate electrode of the second output transistor, and a first electrode of the second output transistor is electrically connected to a second clock signal input end.

In a possible embodiment of the present disclosure, a first electrode of a second output transistor of the second register unit is electrically connected to a second clock signal input end CLK2, and electrically connected to the gate electrode of the first switching transistor or the gate electrode of the second switching transistor.

In a possible embodiment of the present disclosure, the second switching unit includes a third switching transistor, a first electrode of which is electrically connected a second electrode of the second output transistor of the second register unit, and a second electrode of which is electrically connected to the second electrode of the first output transistor.

In a possible embodiment of the present disclosure, a gate electrode of the third switching transistor is electrically connected to the first electrode of the second output transistor of the second register unit.

In a possible embodiment of the present disclosure, the gate electrode of the third switching transistor is electrically connected to the gate electrode of the first switching transistor.

In a possible embodiment of the present disclosure, the gate electrode of the third switching transistor is electrically connected to the gate electrode of the second switching transistor.

In a possible embodiment of the present disclosure, the gate electrode of the third switching transistor is electrically connected to the gate electrode of the first switching transistor and the gate electrode of the second switching transistor.

In another aspect, the present disclosure provides in some embodiments a display device including the above-mentioned gate driving circuit.

In yet another aspect, the present disclosure provides in some embodiments a method for driving the above-mentioned gate driving circuit, including applying a first clock signal to the first register units of the M levels of shift registers connected to each other in cascaded manner, and applying a second clock signal to the second register units of the M levels of shift registers connected to each other in cascaded manner. At an image driving output stage within each frame, the first clock signal includes at least M high-level waveform signals so as to enable the first register units of the M levels of shift registers to output high level signals sequentially, and the second clock signal is at a low level so as to enable the second register units of the M levels of shift registers to output a low level signal. At a sensing driving output stage within each frame, the second clock signal includes at least one high-level waveform signal, so as to enable the second register unit of at least one level of shift register to output the high level signal.

BRIEF DESCRIPTION OF THE DRAWINGS

The other features and advantages will be described hereinafter, and may become apparent from the embodiments of the present disclosure. The following drawings are for illustrative purposes only, but shall not be construed as limiting the present disclosure. In these drawings, a same reference numeral may represent a same member.

DETAILED DESCRIPTION

The present disclosure will be described hereinafter in conjunction with the drawings and embodiments. Such phrases as "one embodiment" and "one of the embodiments" do not necessarily refer to a same embodiment, and the features, structures or characteristics may be combined in any embodiment or embodiments in an appropriate manner.

The present disclosure provides in some embodiments a gate driving circuit, which includes M levels of shift registers. Each level of shift register includes a first register unit and a second register unit. The M first register units of the M levels of shift registers are connected to each other in a cascaded manner, the M second register units of the M levels of shift registers are connected to each other in a cascaded manner, and an output end of the first register unit and an output end of the second register unit of each level of shift register are electrically connected to an output end of the level of shift register, where M is a positive integer greater than or equal to 1. The output ends of the first register unit and the second register unit of each level of shift register are connected to the output end of the level of shift register, so it is able to output a mixed waveform through the cascaded first register units and the cascaded second register units, thereby to meet the requirement for driving external compensation pixel circuit architecture.

Figure 1:
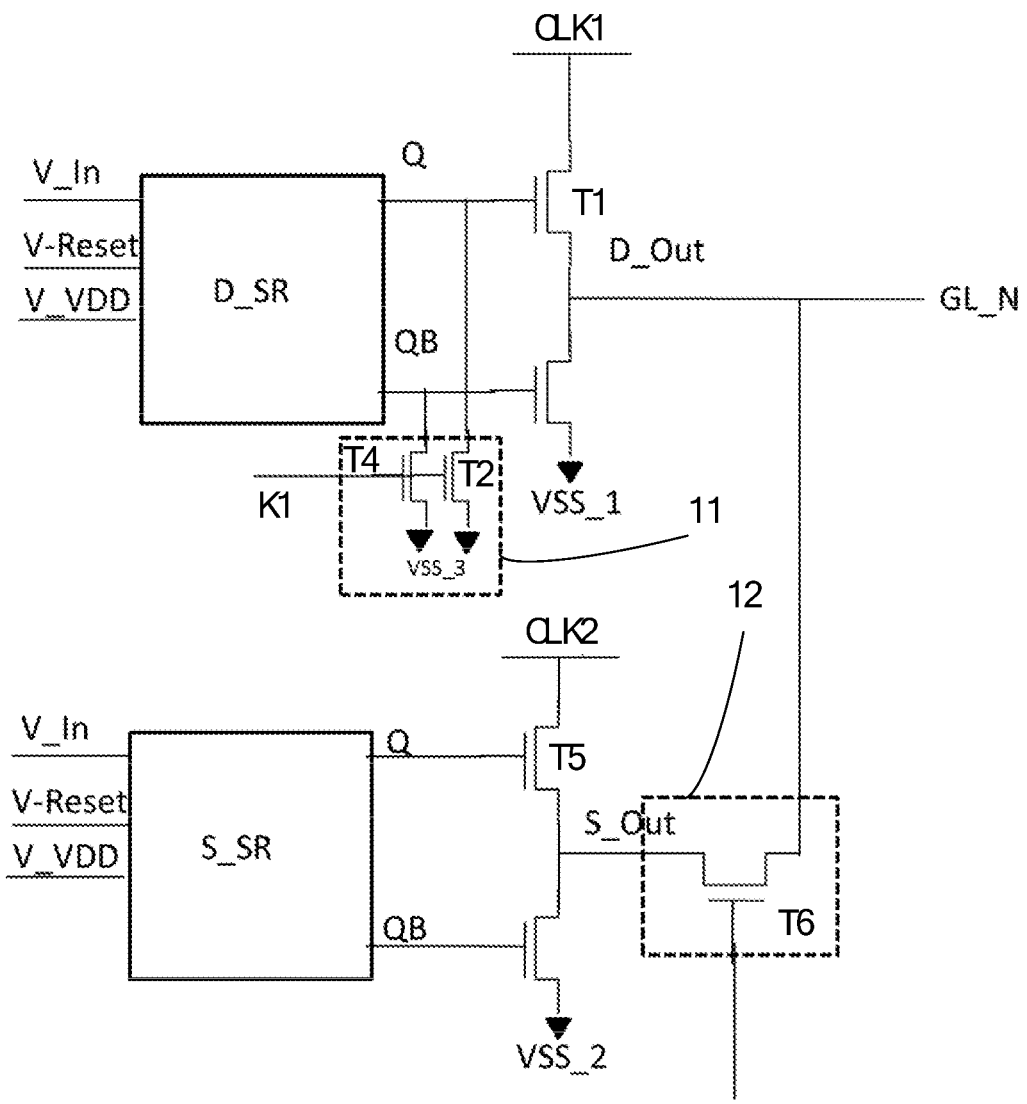
FIG. 1 is a schematic view showing each level of shift register for a gate driving circuit according to one embodiment of the present disclosure.

As shown in FIG. 1, the gate driving circuit may include M levels of shift registers. Each level of shift register may include a first register unit D_SR and a second register unit S_SR. The first register units D_SR of the M levels of shift registers may be connected to each other in a cascaded manner, and the second register units S_SR of the M levels of shift registers may be connected to each other in a cascaded manner. An output end of the first register unit D_SR and an output end of the second register unit S_SR of each level of shift register may be electrically connected (directly or indirectly) to an output end of the level of shift register. M may be a positive integer greater than or equal to 1.

Each level of shift register may include the first register unit and the second register unit. The first register units of the M levels of shift registers may be connected to each other in a cascaded manner, and a first clock signal may be applied to the cascaded first register units, so as to output an image gate driving signal at an image driving output stage within each frame. The second register units of the M levels of shift registers may be connected to each other in a cascaded manner, and a second clock signal may be applied to the cascaded second register units, so as to output a sensing gate driving signal at a sensing driving output stage within each frame. The output ends of the first register unit and the second register unit of each level of shift register may be electrically connected to the output end of the level of shift register. As compared with the related art, in the embodiments of the present disclosure, through inputting the first clock signal with different waveforms and the second clock signal with different waveforms, it is able for the gate driving circuit to output a gate driving signal with a desired mixed waveform, thereby to meet the requirement for driving the external compensation pixel circuit architecture.

In actual use, the first clock signal may be applied to the cascaded first register units of the M levels of shift registers, so as to enable the cascaded first register units to output a first waveform output signal in accordance with the first clock signal. The second clock signal may be applied to the cascaded second register units of the M levels of shift registers, so as to enable the cascaded second register units to output a second waveform output signal. Because the output ends of the first register unit and the second register unit of each level of shift register are electrically connected to the output end of the level of shift register, it is able to mix the first waveform output signal and the second waveform output signal into a signal having a mixed waveform which is determined in accordance with the waveform of the first clock signal and the waveform of the second clock signal.

During the operation, at the image driving output stage within each frame, it is able for the gate driving circuit to drive M levels of pixel circuits, thereby to display an image. At the sensing driving output stage within each frame, it is able for the gate driving circuit to sense at least one level of pixel circuit. The first clock signal may be adopted to generate an image gate driving signal, and the second clock signal may be adopted to generate a sensing gate driving signal. In order to prevent the signal from the cascaded first register units from interfering with the signal from the cascaded second register units at the image driving output stage and the sensing driving output stage within each frame, each level of shift register may include a first switching unit 11 configured to cut off a signal output from the first register unit, and a second switching unit 12 configured to cut off a signal output from the second register unit. At the image driving output stage within each frame, the second switching unit may cut off the signal output from the second register unit, and at the sensing driving output stage within each frame, the first switching unit may cut off the signal output from the first register unit.

Figure 2:
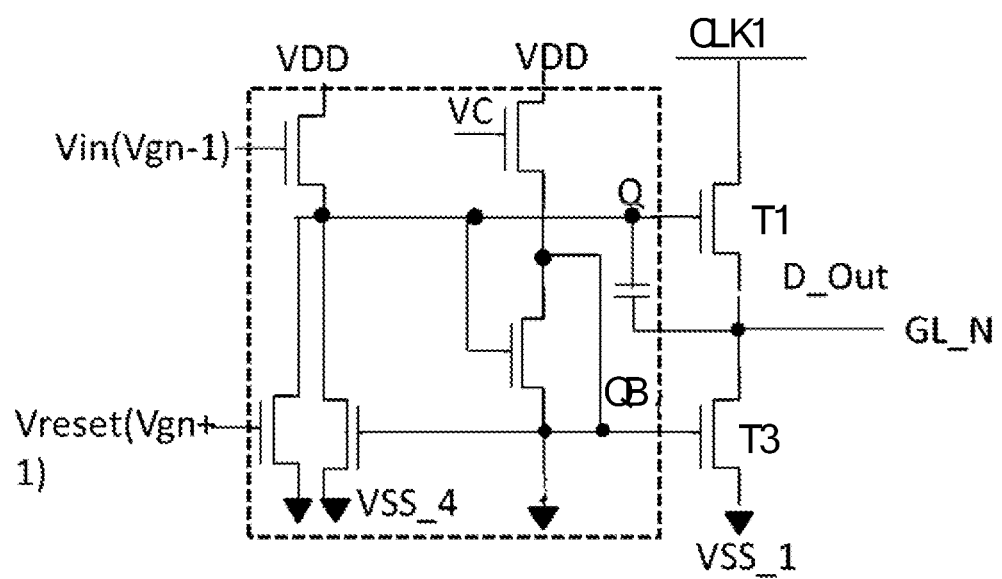
FIG. 2 is a schematic view showing a first register unit of the gate driving circuit according to one embodiment of the present disclosure.

As shown in FIGS. 1 and 2, in order to cut off the signal output from the first register unit, in a possible embodiment of the present disclosure, the first register unit D_SR may include a first input unit and a first output transistor. An output end of the first input unit may be electrically connected to a gate electrode Q of the first output transistor T1, and a first electrode of the first output transistor T1 of the first register unit may be electrically connected to the first clock signal input end CLK1. The first clock signal may be applied to the first clock signal input end CLK1, so as to enable the first input unit to output a high level through its output end in accordance with the received input signal, thereby to turn on the first output transistor and output the first clock signal. A control switch of the first switching unit may be arranged, but not limited to, at a second electrode of the first output transistor. In another possible embodiment of the present disclosure, the first switching unit 11 may include a first switching transistor T2, a first electrode of which is electrically connected to the gate electrode of the first output transistor T1, and a second electrode of which is connected to a low level end. The low level end may be a ground end or a voltage end where a voltage is smaller than the level of the first clock signal. At the sensing driving output stage within each frame, a high level may be applied to a gate electrode of the first switching transistor, so as to turn on the first switching transistor, thereby to turn off the first output transistor and cut off the signal output from the first register unit.

The first register unit D_SR may further include a first pull-down transistor T3, a first electrode of which is electrically connected to the second electrode of the first output transistor T1, and a second electrode of which is connected to the low level end. The low level end may be a ground end or a voltage end where a voltage is smaller than the high level of the first clock signal. A high level may be applied to a gate electrode of the first pull-down transistor, so as to turn on the first pull-down transistor, thereby to pull down a potential at the first register unit. The first switching unit 11 may further include a second switching transistor T4, a first electrode of which is electrically connected to the gate electrode QB of the first pull-down transistor T3, and a second electrode of which is connected to the low level end. At the sensing driving output stage within each frame, a high level may be applied to a gate electrode of the second switching transistor, so as to turn on the second switching transistor, thereby to turn off the first pull-down transistor and prevent the signal from the cascaded second register units from being adversely affected by the on-state first pull-down transistor.

Figure 6:
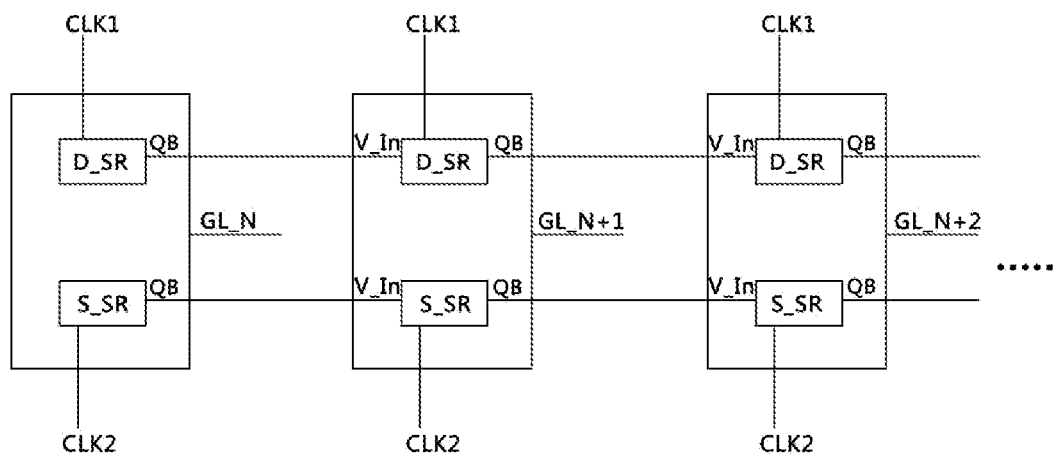
FIG. 6 is a schematic view showing the gate driving circuit where the shift registers are connected to each other in a cascaded manner according to one embodiment of the present disclosure.

As shown in FIG. 6, among the M levels of shift registers in the gate driving circuit, the gate electrode QB of the first pull-down transistor T3 of a current-level first register unit may be configured to apply a signal to the first input unit of a next-level first register unit, and the gate electrode of the second pull-down transistor of a current-level second register unit may be configured to apply a signal to the second input unit of a next-level second register unit.

A gate line for the first switching transistor may be arranged separate from a gate line for the second switching transistor. In order to reduce the number of the signal lines, the gate electrode of the first switching transistor T2 may be electrically connected to the gate electrode of the second switching transistor T4, i.e., the two switching transistors maybe controlled through merely one gate line K1.

Figure 3:
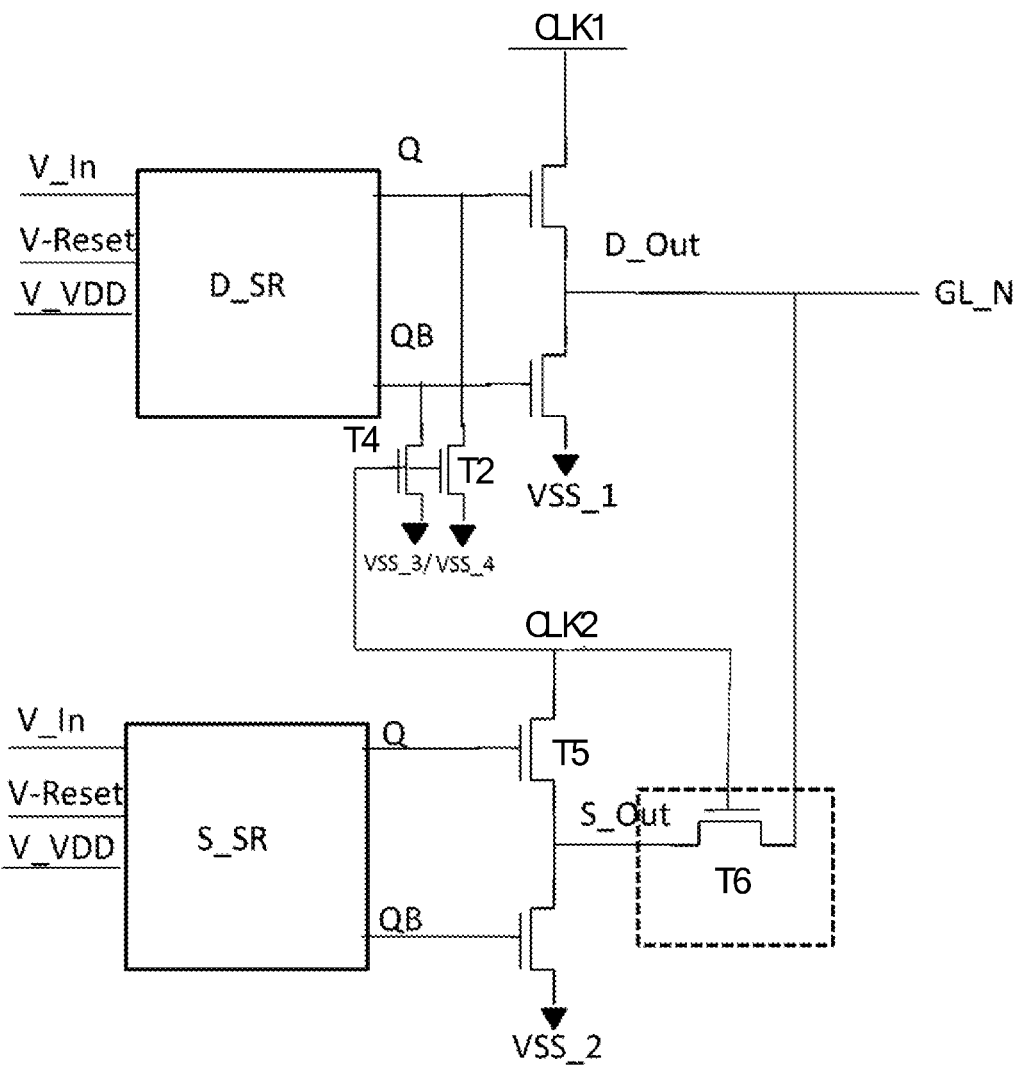
FIG. 3 is another schematic view showing each level of shift register for the gate driving circuit according to one embodiment of the present disclosure.

The second register unit may include a second input unit and a second output transistor. An output end of the second input unit may be electrically connected to a gate electrode of the second output transistor, and a first electrode of the second output transistor of the second register unit may be electrically connected to a second clock signal input end CLK2. As shown in FIG. 3, in order to further reduce the number of gate lines, a first electrode of the second output transistor T5 of the second register unit may be electrically connected to the second clock signal input end CLK2, and electrically connected to the gate electrode of the first switching transistor T2 or the gate electrode of the second switching transistor T4. During the operation, the second clock signal input end CLK2 may output a high level at the entire sensing driving output stage within each frame or at a part of the sensing driving output stage within each frame, i.e., the second clock signal input end CLK2 may serve as the gate line for the first switching transistor and the second switching transistor.

As shown in FIG. 1, in order to cut off the signal output from the second register unit, in a possible embodiment of the present disclosure, the second switching unit 12 may include a third switching transistor T6, a first electrode of which is electrically connected to a second electrode of the second output transistor T5, and a second electrode of which is electrically connected to the second electrode of the first output transistor T1. At the image driving output stage within each frame, a low level may be applied to a gate electrode of the third switching transistor, so as to turn off the third switching transistor and turn off the second output transistor, thereby to cut off the signal output from the second register unit and prevent the signal output from the first register unit from being adversely affected by the signal output from the second register unit.

As shown in FIG. 3, in order to further reduce the number of the gate lines, the gate electrode of the third switching transistor T6 may be electrically connected to the first electrode of the second output transistor T5 of the second output unit. During the operation, the second clock signal input end CLK2 may output a high level at the entire sensing driving output stage within each frame or at a part of the sensing driving output stage within each frame, i.e., the second clock signal input end CLK2 may serve as the gate line for the third switching transistor, so as to turn on the third switching transistor. To be specific, a gate electrode of the third switching transistor T6 may be further electrically connected to the gate electrode of the second switching transistor T4, so that the second clock signal input end CLK2 may serve as the gate line for the second switching transistor and the gate line for the third switching transistor simultaneously. Alternatively, the gate electrode of the third switching transistor T6 may be further electrically connected to the gate electrode of the first switching transistor T2 and the gate electrode of the second switching transistor T4, so that the second clock signal input end CLK2 may serve as the gate line for the first switching transistor, the second switching transistor and the third switching transistor simultaneously.

Figure 4:
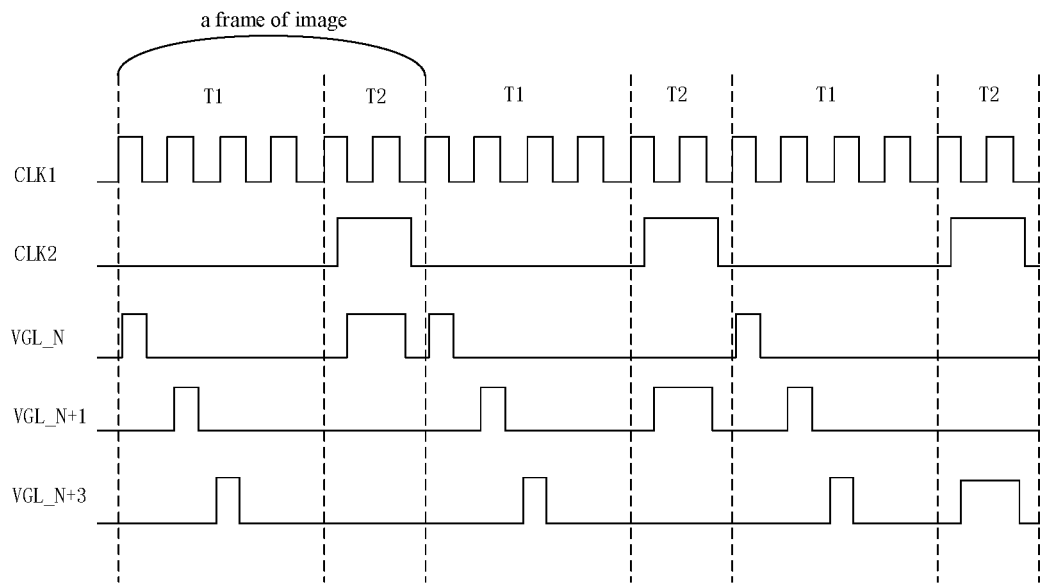
FIG. 4 is a time sequence diagram of the gate driving circuit according to one embodiment of the present disclosure.

As shown in FIG. 4, in a sequence diagram of the gate driving circuit, the first clock signal CLK1 may be applied to the cascaded first register units of the M levels of shift registers, and a second clock signal CLK2 may be applied to the cascaded second register units of the M levels of shift registers. At the image driving output stage within each frame, the first clock signal may include at least M high-level waveform signals, so as to enable the cascaded first register units of the M levels of shift registers to output high level signals sequentially. The second clock signal may be at a low level, so as to enable the cascaded second register units of the M levels of shift registers to output a low level signal. At the sensing driving output stage within each frame, the second clock signal may include at least one high-level waveform signal, so as to drive the second register unit of at least one level of shift register to output a high level signal. Within each frame, at the image driving output stage T1, the first register units (e.g., VGL_N, VGL_N+1 and VGL_N+3) of the M levels of shift registers may output the high level signals sequentially. In consecutive frames, at the image driving output stage T1, the first register units of the M levels of shift registers may output the high level signals within different frames sequentially.

The present disclosure further provides in some embodiments a display device including a gate driving circuit. The gate driving circuit includes M levels of shift registers. First register units of the M levels of shift registers are connected to each other in a cascaded manner, and second register units of the M levels of shift registers are connected to each other in a cascaded manner. Output ends of the first register unit and the second register unit of each level of shift register are connected to an output end of the level of shift register, so it is able to output a mixed waveform through the cascaded first register units and the cascaded second register units, thereby to meet the requirement for driving external compensation pixel circuit architecture.

The display device may include a gate driving circuit which includes M levels of shift registers. Each level of shift register may include a first register unit and a second register unit. The first register units of the M levels of shift registers may be connected to each other in a cascaded manner, and the second register units of the M levels of shift registers may be connected to each other in a cascaded manner. An output end of the first register unit and an output of the second register unit of each level of shift register may be electrically connected to an output end of the level of shift register. M may be a positive integer greater than or equal to 5. The output end of each level of shift register may be electrically connected to a gate electrode of a corresponding level of pixel circuit.

The gate driving circuit may be that mentioned above, and a structure thereof may refer to the relevant description hereinabove, which will thus not be particularly defined herein.

According to the display device in the embodiments of the present disclosure, it is able to output the gate driving signal with a mixed waveform through the gate driving circuit, thereby to meet the requirement for driving the pixel circuit.

Figure 5:
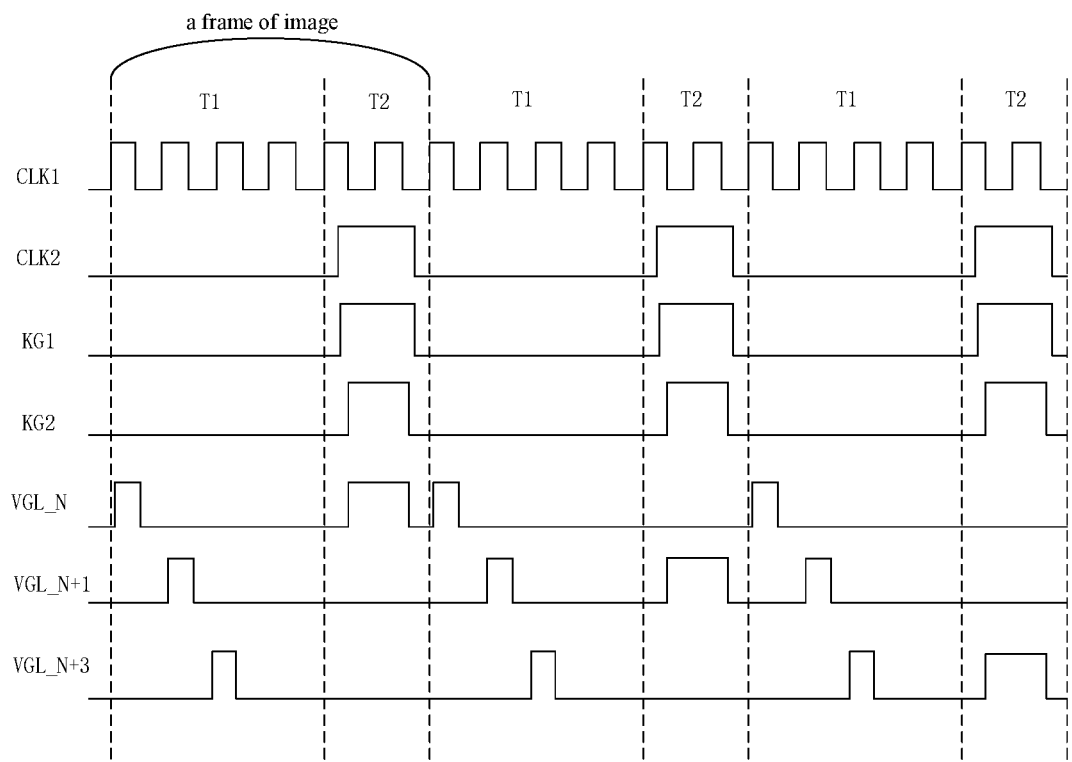
FIG. 5 is another sequence diagram of the gate driving circuit according to one embodiment of the present disclosure.

The present disclosure further provides in some embodiments a method for driving the above-mentioned gate driving circuit which, as shown in FIG. 5, includes applying a first clock signal CLK1 to the first register units of the M levels of shift registers connected to each other in cascaded manner, and applying a second clock signal CLK2 to the second register units of the M levels of shift registers connected to each other in cascaded manner. At an image driving output stage within each frame, the first clock signal includes at least M high-level waveform signals so as to enable the first register units of the M levels of shift registers connected to each other in cascaded manner to output high level signals sequentially, and the second clock signal is at a low level so as to enable the second register units of the M levels of shift registers connected to each other in cascaded manner to output a low level signal. At a sensing driving output stage within each frame, the second clock signal includes at least one high-level waveform signal, so as to enable the second register unit of at least one level of shift register to output the high level signal.

It should be appreciated that, an initial stage, a first start signal may be applied to the cascaded first register units of the M levels of shift registers, so as to enable the first register units of the M levels of shift registers to output gate driving signals sequentially in accordance with the first clock signal. A second start signal may be applied to the cascaded second register units of the M levels of shift registers, so as to enable the second register units of the M levels of shift registers to output gate driving signals sequentially in accordance with the second clock signal. Through adjusting waveforms of the first clock signal and the second clock signal, it is able to meet the requirement on different mixed waveforms for a pixel circuit.

In some embodiments of the present disclosure, each level of shift register may include a first switching unit configured to cut off a signal output from the first register unit, and a second switching unit configured to cut off a signal output from the second register unit. At the image driving output stage within each frame, the second switching unit may cut off the signal output from the second register unit, and at the sensing driving output stage within each frame, the first switching unit may cut off the signal output from the first register unit. The first register unit may include a first input unit and a first output transistor. An output end of the first input unit may be electrically connected to a gate electrode of the first output transistor, and a first electrode of the first output transistor of the first register unit may be electrically connected to the first clock signal input end CLK1. The first switching unit may include a first switching transistor, a first electrode of which is electrically connected to the gate electrode of the first output transistor, and a second electrode of which is connected to a low level end. The first register unit may further include a first pull-down transistor, a first electrode of which is electrically connected to the second electrode of the first output transistor, and a second electrode of which is connected to the low level end. The first switching unit may further include a second switching transistor, a first electrode of which is electrically connected to the gate electrode of the first pull-down transistor, and a second electrode of which is connected to the low level end. A gate electrode of the first switching transistor may be electrically connected to a gate electrode of the second switching transistor. The second switching unit may include a third switching transistor, a first electrode of which is electrically connected to a second electrode of the second output transistor, and a second electrode of which is electrically connected to the second electrode of the first output transistor.

At the image driving output stage T1 within each frame, a low level may be applied to the control line KG1 for the gate electrode of the first switching transistor, the gate electrode of the second switching transistor and the gate electrode of the third switching transistor, so as to enable the cascaded second register units of the M levels of shift registers to output a low level signal, thereby to prevent the output from the cascaded first register units of the M levels of shift registers from being adversely affected.

At at least part of the sensing driving output stage T2 within each frame, a high level may be applied to the control line KG2 for the gate electrode of the first switching transistor, the gate electrode of the second switching transistor and the gate electrode of the third switching transistor, so as to enable the cascaded second register units of the M levels of shift registers to output a high level signal, thereby to sense the pixel circuit.

Each of the above embodiments merely focuses on the difference from the others, and the same or similar contents in the embodiments will not be repeated.

It should be appreciated that, the relevant features in the above device may refer to each other. In addition, the serial number of the embodiments is for illustrative purposes only, and none of them is superior to the others.

Although with a large amount of details mentioned hereinabove, the present disclosure will be practiced without these details. In some embodiments of the present disclosure, structures and techniques known in the art will not be described, so as not to confuse the understanding of the present disclosure.

Similarly, it should be appreciated that, in order to facilitate the understanding of the present disclosure, the features may be grouped in a single component, drawing or the relevant description. However, the disclosed device shall not be interpreted as to include more features that those defined in each of the appended claims. More definitely, as those defined in the appended claims, each aspect of the present disclosure may include the features less than the features in a single one of the above-mentioned embodiments. Hence, the claims for a specific embodiment may be definitely incorporated into the embodiment, and each claim itself may serve as a separate embodiment of the present disclosure.

It should be further appreciated that, the members of the device in a specific embodiment may be changed adaptively and arranged in one or more devices different from that mentioned in the embodiment. In addition, the members may be combined into a single member, or divided into more members. Apart from the features that are mutually exclusive, the other features described in the specification (including the appended claims, the abstract and the drawings) may be combined in any form. Unless otherwise defined, each feature in the specification (including the appended claims, the abstract and the drawings) may be replaced with another feature for an identical, equivalent or similar purpose.

It should be further appreciated that, although some embodiments of the present disclosure include some, but not the other, features in the other embodiments, the combination of the features in different embodiments shall also fall within the scope of the present disclosure. For example, any of the embodiments corresponding to the appended claims may be combined in any form. The members in the embodiments of the present disclosure may be implemented as hardware, or implemented in a combined manner.

It should be further appreciated that, the above embodiments are for illustrative, but not restrictive, purposes, and substitutions may be made without departing from the scope as set forth in the appended claims. In the appended claims, any reference numeral in parenthesis shall not be construed as limiting the claims. The word "include" shall not be construed as excluding any other member or component not defined in the claims. The expression "one" or "one of" ahead of a member or component shall not be construed as excluding more than one member or component. The scheme in the present disclosure may be implemented through a device including different members. In the appended claims where several members have been defined, some of these members may be implemented as a same member. The words "first", "second" and "third" shall not be used to represent any order, and these words may be interpreted as nomenclatures.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driving circuit for driving an external compensation pixel circuit, comprising M levels of shift registers, wherein
   each level of shift register comprises a first register unit for outputting an image gate driving signal and a second register unit for outputting a sensing gate driving signal,
   the first register units of the M levels of shift registers are connected to each other in a cascaded manner,
   the second register units of the M levels of shift registers are connected to each other in a cascaded manner,
   an output end of the first register unit and an output end of the second register unit of each level of shift register are electrically connected to an output end of the level of shift register,
   where M is a positive integer greater than or equal to 1,
   wherein each level of shift register further comprises:
   a first switching unit configured to cut off a signal outputted from the output end of the first register unit, and
   a second switching unit configured to cut off a signal outputted from the output end of the second register unit,
   the first register unit comprises:
   a first input unit and a first output transistor, an output end of the first input unit is electrically connected to a gate electrode of a first output transistor, and a first electrode of the first output transistor is electrically connected to a first clock signal input end;
   a first pull-down transistor, a first electrode of a first pull-down transistor is electrically connected to a second electrode of the first output transistor, and a second electrode of the first pull-down transistor is connected to a low level end;
   wherein the first switching unit comprises:
   a first switching transistor, a first electrode of the first switching transistor is electrically connected to the gate electrode of the first output transistor, and a second electrode of the first switching transistor is connected to the low level end;
   a second switching transistor, a first electrode of the second switching transistor is electrically connected to a gate electrode of the first pull-down transistor, and a second electrode of the second switching transistor is connected to the low level end;
   wherein a gate electrode of the first switching transistor is directly electrically connected to a gate electrode of the second switching transistor.

2. The gate driving circuit according to claim 1, wherein the second register unit comprises a second input unit and a second output transistor, an output end of the second input unit is electrically connected to a gate electrode of the second output transistor, and a first electrode of the second output transistor is electrically connected to a second clock signal input end.

3. The gate driving circuit according to claim 2, wherein the second switching unit comprises a third switching transistor, a first electrode of the third switching transistor is electrically connected a second electrode of the second output transistor of the second register unit, and a second electrode of the third switching transistor is electrically connected to the second electrode of the first output transistor.

4. A display device, comprising the gate driving circuit according to claim 1.

5. A method for driving the gate driving circuit according to claim 1, comprising applying a first clock signal to the first register units of the M levels of shift registers connected to each other in cascaded manner, and applying a second clock signal to the second register units of the M levels of shift registers connected to each other in cascaded manner, wherein
   at an image driving output stage within each frame, the first clock signal comprises at least M high-level waveform signals to enable the first register units of the M levels of shift registers to output high level signals sequentially, and the second clock signal is at a low level to enable the second register units of the M levels of shift registers to output a low level signal, and at a sensing driving output stage within each frame, the second clock signal comprises at least one high-level waveform signal, to enable the second register unit of at least one level of shift register to output the high level signal.

6. A gate driving circuit for driving an external compensation pixel circuit, comprising M levels of shift registers, wherein
each level of shift register comprises a first register unit for outputting an image gate driving signal and a second register unit for outputting a sensing gate driving signal,
the first register units of the M levels of shift registers are connected to each other in a cascaded manner,
the second register units of the M levels of shift registers are connected to each other in a cascaded manner,
an output end of the first register unit and an output end of the second register unit of each level of shift register are electrically connected to an output end of the level of shift register,
where M is a positive integer greater than or equal to 1,
wherein each level of shift register further comprises:
a first switching unit configured to cut off a signal outputted from the output end of the first register unit, and
a second switching unit configured to cut off a signal outputted from the output end of the second register unit,
wherein the first switching unit comprises a first switching transistor, a first electrode of the first switching transistor is electrically connected to the gate electrode of the first output transistor, and a second electrode of the first switching transistor is connected to the low level end;
wherein the first switching unit further comprises a second switching transistor, a first electrode of the second switching transistor is electrically connected to a gate electrode of the first pull-down transistor, and a second electrode of the second switching transistor is connected to the low level end;
wherein a first electrode of a second output transistor of the second register unit is electrically connected to a second clock signal input end, and directly electrically connected to the gate electrode of the first switching transistor or the gate electrode of the second switching transistor.

7. A gate driving circuit for driving an external compensation pixel circuit, comprising M levels of shift registers, wherein
each level of shift register comprises a first register unit for outputting an image gate driving signal and a second register unit for outputting a sensing gate driving signal,
the first register units of the M levels of shift registers are connected to each other in a cascaded manner,
the second register units of the M levels of shift registers are connected to each other in a cascaded manner,
an output end of the first register unit and an output end of the second register unit of each level of shift register are electrically connected to an output end of the level of shift register,
where M is a positive integer greater than or equal to 1,
wherein each level of shift register further comprises:
a first switching unit configured to cut off a signal outputted from the output end of the first register unit, and
a second switching unit configured to cut off a signal outputted from the output end of the second register unit;
wherein the second register unit comprises a second input unit and a second output transistor, an output end of the second input unit is electrically connected to a gate electrode of the second output transistor, and a first electrode of the second output transistor is electrically connected to a second clock signal input end;
wherein the second switching unit comprises a third switching transistor, a first electrode of the third switching transistor is electrically connected a second electrode of the second output transistor of the second register unit, and a second electrode of the third switching transistor is electrically connected to the second electrode of the first output transistor;
wherein a gate electrode of the third switching transistor is directly electrically connected to the first electrode of the second output transistor of the second register unit, the gate electrode of the first switching transistor, and the gate electrode of the second switching transistor.

* * * * *